(12) United States Patent
Okumura

(10) Patent No.: US 10,886,862 B2
(45) Date of Patent: Jan. 5, 2021

(54) SEMICONDUCTOR DEVICE

(71) Applicant: JTEKT CORPORATION, Osaka (JP)

(72) Inventor: Nobutaka Okumura, Okazaki (JP)

(73) Assignee: JTEKT CORPORATION, Osaka (JP)

( * ) Notice: Subject to any disclaimer, the term of this patent is extended or adjusted under 35 U.S.C. 154(b) by 336 days.

(21) Appl. No.: 16/000,095

(22) Filed: Jun. 5, 2018

(65) Prior Publication Data

US 2018/0367071 A1 Dec. 20, 2018

(30) Foreign Application Priority Data

Jun. 15, 2017 (JP) ................................. 2017-117719

(51) Int. Cl.
*H01L 29/40* (2006.01)
*H02P 6/10* (2006.01)
(Continued)

(52) U.S. Cl.
CPC .............. *H02P 6/10* (2013.01); *H01L 23/481* (2013.01); *H02M 7/003* (2013.01); *H02M 7/5387* (2013.01); *H03K 17/162* (2013.01); *H05K 1/0216* (2013.01); *B62D 5/0463* (2013.01); *H05K 1/0263* (2013.01); *H05K 2201/10166* (2013.01); *H05K 2201/10545* (2013.01)

(58) Field of Classification Search
CPC ... H01L 23/481; H02M 7/003; H02M 7/5387; H02P 6/10; H03K 17/162; H05K 1/0216; H05K 1/0263; H05K 2201/10166; H05K 2201/10545; G05B 13/028; G05B 19/4183; G05B 19/4184; G05B 19/41845; G05B 19/4185; G05B 19/41865; G05B 19/41875; G05B 2219/32287; G05B 2219/35001; G05B 2219/37337; G05B 2219/37351; G05B 2219/37434; G05B 2219/40115; G05B 2219/45004; G05B 2219/45129; G05B 23/0221; G06K 9/6263; G06K 9/62; G06K 9/6262
See application file for complete search history.

(56) References Cited

U.S. PATENT DOCUMENTS

2013/0056755 A1  3/2013 Hatai et al.
2013/0307129 A1* 11/2013 Fujita ................... H01L 23/4952
                                                              257/666
(Continued)

FOREIGN PATENT DOCUMENTS

JP    2004-022844 A    1/2004
JP    2010-195219 A    9/2010
(Continued)

OTHER PUBLICATIONS

Nov. 13, 2018 Extended European Search Report issued in European Patent Application No. 18176965.4.

*Primary Examiner* — Robert G Bachner
(74) *Attorney, Agent, or Firm* — Oliff PLC

(57) ABSTRACT

A third upper MOS and a third motor relay are disposed on a front surface of a substrate. A third shunt resistor and a third lower MOS are disposed on a back surface of the substrate. The substrate has a via electrically connecting interconnects. Thus, a source electrode of the third upper MOS and a drain electrode of the third motor relay are electrically connected to a source electrode of the third lower MOS by the via.

6 Claims, 13 Drawing Sheets

(51) Int. Cl.
*H03K 17/16* (2006.01)
*H02M 7/00* (2006.01)
*H05K 1/02* (2006.01)
*H01L 23/48* (2006.01)
*H02M 7/5387* (2007.01)
*B62D 5/04* (2006.01)

(56) References Cited

U.S. PATENT DOCUMENTS

2014/0264627 A1\* 9/2014 Park ................. H01L 27/088
 257/394
2018/0226383 A1\* 8/2018 Yamaguchi ........... H02M 7/003

FOREIGN PATENT DOCUMENTS

| WO | 2016/177491 A1 | 11/2016 |
| WO | 2017/047345 A1 | 3/2017 |

\* cited by examiner

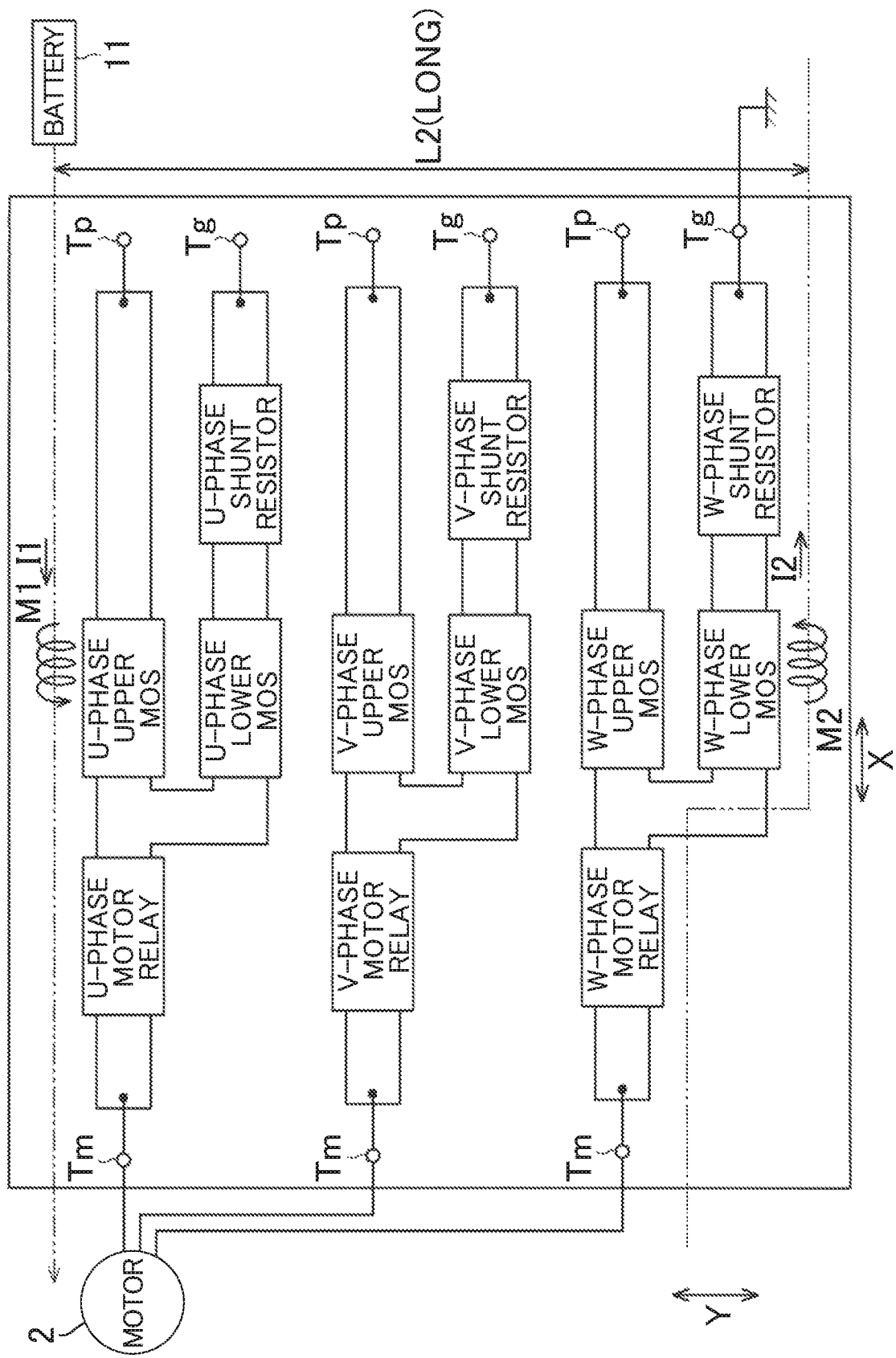

US 10,886,862 B2

SEMICONDUCTOR DEVICE

INCORPORATION BY REFERENCE

The disclosure of Japanese Patent Application No. 2017-117719 filed on Jun. 15, 2017 including the specification, drawings and abstract, is incorporated herein by reference in its entirety.

BACKGROUND OF THE INVENTION

1. Field of the Invention

The present invention relates to a semiconductor device.

2. Description of Related Art

Electric power steering system includes a motor serving as a source of generating an assisting force. The motor is driven by a drive circuit, for example. The drive circuit includes a switching element group that is disposed on a substrate and generates three-phase AC power.

Japanese Patent Application Publication No. 2010-495219 discloses a drive circuit in which field effect transistors (FETs) as the components of drive circuits of respective phases (U-phase, V-phase, and W-phase) are disposed on a substrate. When arranging FETs on a substrate, drive circuits of respective phases are usually disposed adjacent to each other on one side of the substrate (see FIG. 6 for a comparative example). In this case, power supplied from, for example, a battery is transmitted to a motor via the drive circuit of the U-phase and then is transmitted to ground via the drive circuit of the W-phase. With this path, the length of the path (wiring loop) through which a current flows is maximized, so that interlinkage flux with respect to the wiring loop is increased. When the interlinkage flux of the drive circuit is increased, the surge voltage at switching is increased. Also, the torque ripple is increased. There is therefore a need for a method that reduces the interlinkage flux of the drive circuit.

Reducing interlinkage flux has a significance not only in the case where the wiring loop is maximized, but also in the case where power supplied from, for example, a battery is transmitted to a motor via a drive circuit of the U-phase, and then is transmitted to ground via a drive circuit of the V-phase. This is because, even in such a case, the surge voltage at switching can be reduced.

SUMMARY OF THE INVENTION

An object of the present invention is to provide a semiconductor device with reduced interlinkage flux.

According to an aspect of the present invention, there is provided a semiconductor device including: a substrate; and a plurality of half bridges disposed on the substrate and each including an upper switching element and a lower switching element connected in series, the upper switching element being connected to a power supply, the lower switching element being connected to ground; wherein the plurality of half bridges are connected in parallel; wherein at least one of the upper switching elements is disposed on a first surface of the substrate, and the lower switching elements are disposed on a second surface of the substrate opposite to the first surface; and wherein the substrate includes a path electrically connecting the upper switching element and the lower switching element belonging to a same one of the half bridges, the path having a portion extending through the substrate.

BRIEF DESCRIPTION OF THE DRAWINGS

The foregoing and further features and advantages of the invention will become apparent from the following description of example embodiments with reference to the accompanying drawings, wherein like numerals are used to represent like elements and wherein:

FIG. 6 is a top view illustrating the magnitude of interlinkage flux generated in a drive circuit of a comparative example;

DETAILED DESCRIPTION OF EMBODIMENTS

Hereinafter, a first embodiment will be described in which a drive circuit as a semiconductor device is applied to a vehicle drive device.

Figure 1:
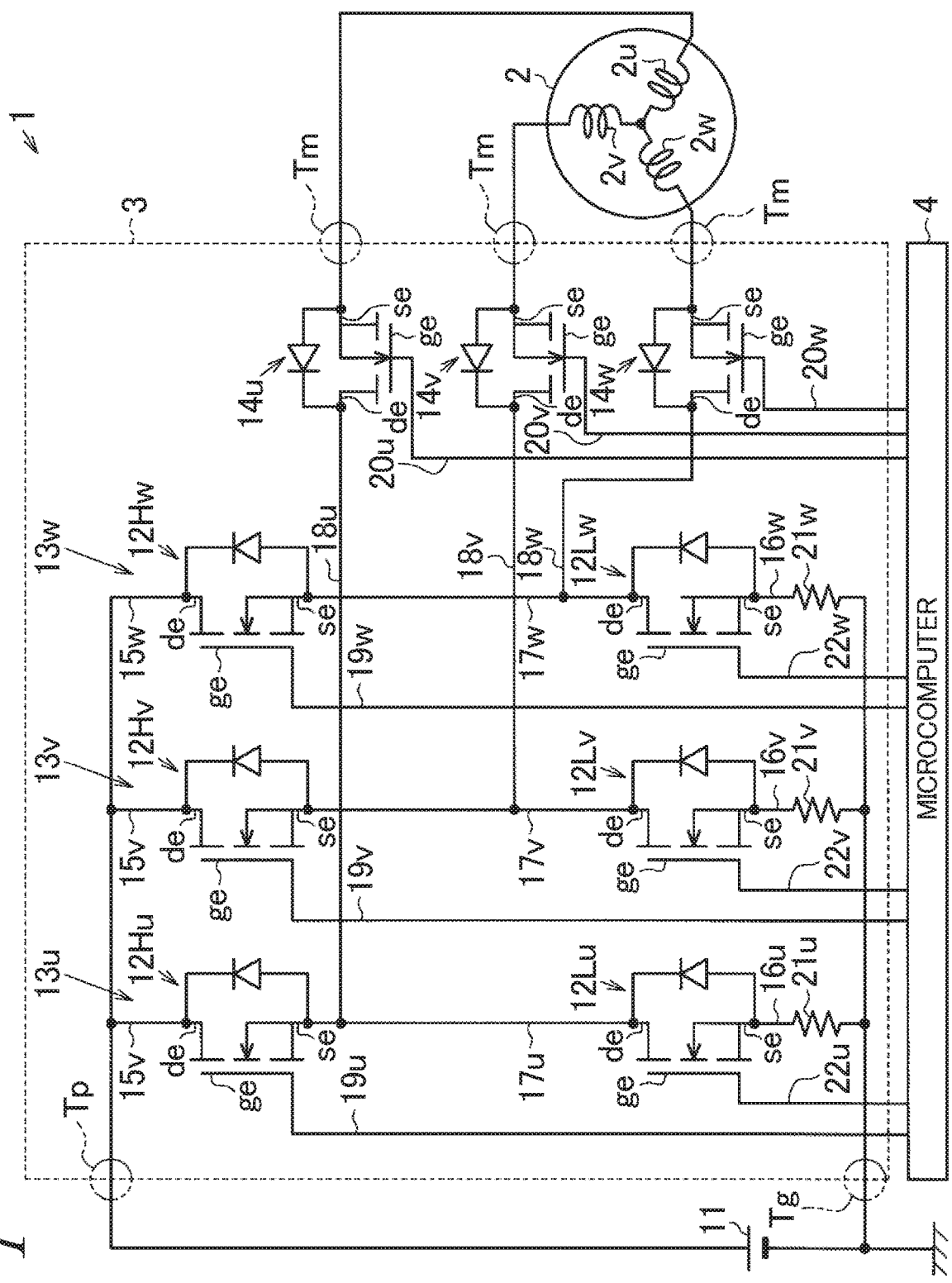
FIG. 1 is a circuit diagram illustrating the schematic configuration of a vehicle drive device using a drive circuit of a first embodiment.

A drive device 1 illustrated in FIG. 1 supplies power to a motor 2 (power supply target) for applying an assisting force to a steering system of a vehicle. The motor 2 used herein is a three-phase (U-phase, V-phase, and W-phase) brushless motor. The drive device 1 includes a drive circuit 3 that supplies power to the motor 2, a microcomputer 4 that controls the operation of the drive circuit 3.

The drive circuit 3 includes a plurality of switching elements. The drive circuit 3 converts DC power from a battery 11 mounted on the vehicle into three-phase AC power by turning ON and OFF the plurality of switching elements. The switching elements used herein are metal-oxide-semiconductor field-effect-transistors (MOS-FETs).

The drive circuit 3 includes first to third upper MOSs 12Hu, 12Hv, and 12Hw connected to the battery side, and first to third lower MOSs 12Lu, 12Lv, and 12Lw connected to ground. The drive circuit 3 is formed by connecting first to third switching arms 13u, 13v, and 13w in parallel, each including two switching elements. The first switching arm 13u includes the first upper MOS 12Hu and the first lower MOS 12Lu connected in series. The second switching arm 13v includes the second upper MOS 12Hv and the second lower MOS 12Lv connected in series. The third switching arm 13w includes the third upper MOS 12Hw and the third lower MOS 12Lw connected in series.

Drain electrodes de of the first to third upper MOSs 12Hu, 12Hv, and 12Hw are connected to the battery 11 via drain interconnects 15u, 15v, and 15w, respectively. Source electrodes se of the first to third lower MOSs 12Lu, 12Lv, and 12Lw are connected to ground via source interconnects 16u, 16v, and 16w, respectively. Further, source electrodes se of the first to third upper MOSs 12Hu, 12Hv, and 12Hw are connected to drain electrodes de of the first to third lower MOSs 12Lu, 12Lv, and 12Lw via intermediate interconnects 17u, 17v, and 17w, respectively. Further, the intermediate interconnects 17n, 17v, and 17w (midpoints of the first to third switching arms 13u, 13v, and 13w) are connected to motor coils 2u, 2v, and 2w of the respective phases via power lines 18u, 18v, and 18w, respectively.

The microcomputer 4 is connected to gate electrodes ge of the first to third upper MOSs 12Hu, 12Hv, and 12Hw and the first to third lower MOSs 12Lu, 12Lv, and 12Lw, via gate interconnects 19u, 19v, and 19w and gate interconnects 22u, 22v, and 22w, respectively. The microcomputer 4 obtains the state quantities such as steering torque and rotation angle of the motor 2, detected by various sensors mounted on the vehicle, and generates a motor control signal (voltage signal) based on these state quantities. Then, the microcomputer 4 applies the motor control signal to each gate electrode ge, thereby controlling ON and OFF of the first to third upper MOSs 12Hu, 12Hv, and 12Hw and the first to third lower MOSs 12Lu, 12Lv, and 12Lw. The first to third upper MOSs 12Hu, 12Hv, and 12Hw and the first to third lower MOSs 12Lu, 12Lv, and 12Lw are turned ON and OFF in accordance with the motor control signal. Thus, DC power of the battery 11 is converted into three-phase AC power. The three-phase AC power is supplied to the motor 2 via the power lines 18u, 18v, and 18w.

The drive circuit 3 further includes first to third motor relays 14u, 14v, and 14w. The first to third motor relays 14u, 14v, and 14w are provided in the middle of the power lines 18u, 18v, and 18w, respectively. The first to third motor relays 14u, 14v, and 14w used herein are MOS-FETs, for example. The first to third motor relays 14u, 14v, and 14w are normally maintained in an ON state. The first to third motor relays 14u, 14v, and 14w are switched to an OFF state in the event of a disconnection failure, a short-circuit failure, or the like, in the drive circuit 3, for example. When the power supply path (power lines 18u, 18v, and 18w) between the drive circuit 3 and the motor 2 is blocked, power supply from the drive circuit 3 to the motor 2 is blocked. Gate electrodes ge of the first to third motor relays 14u, 14v, and 14w are connected to the microcomputer 4 via gate interconnects 20u, 20v, and 20w, respectively. The microcomputer 4 applies and stops applying a voltage signal, thereby controlling ON and OFF of the first to third motor relays 14u, 14v, and 14w.

To detect a current actually applied to the motor 2, first to third shunt resistors 21u, 21v, and 21w are respectively provided between the first to third switching arms 13u, 13v, and 13w of the respective phases and ground. The microcomputer 4 detects the voltages across the respective first to third shunt resistors 21u, 21v, and 21w, thereby detecting the values of the currents actually flowing through the respective phases of the motor 2.

Next, the schematic configuration of the drive circuit 3 will be described with reference to FIGS. 2A and 2B. For illustration purposes, in FIG. 2A, interconnects as the components of the drive circuit 3 disposed on the front surface (first surface) of a substrate B are drawn larger than the components of the drive circuit 3 disposed on the back surface (second surface) of the substrate B. Further, in FIG. 2A, the components of the drive circuit 3 on the front surface when the substrate B is viewed from the front surface side are indicated by continuous lines, and the components on the back surface are indicated by dashed lines.

Figure 2A:
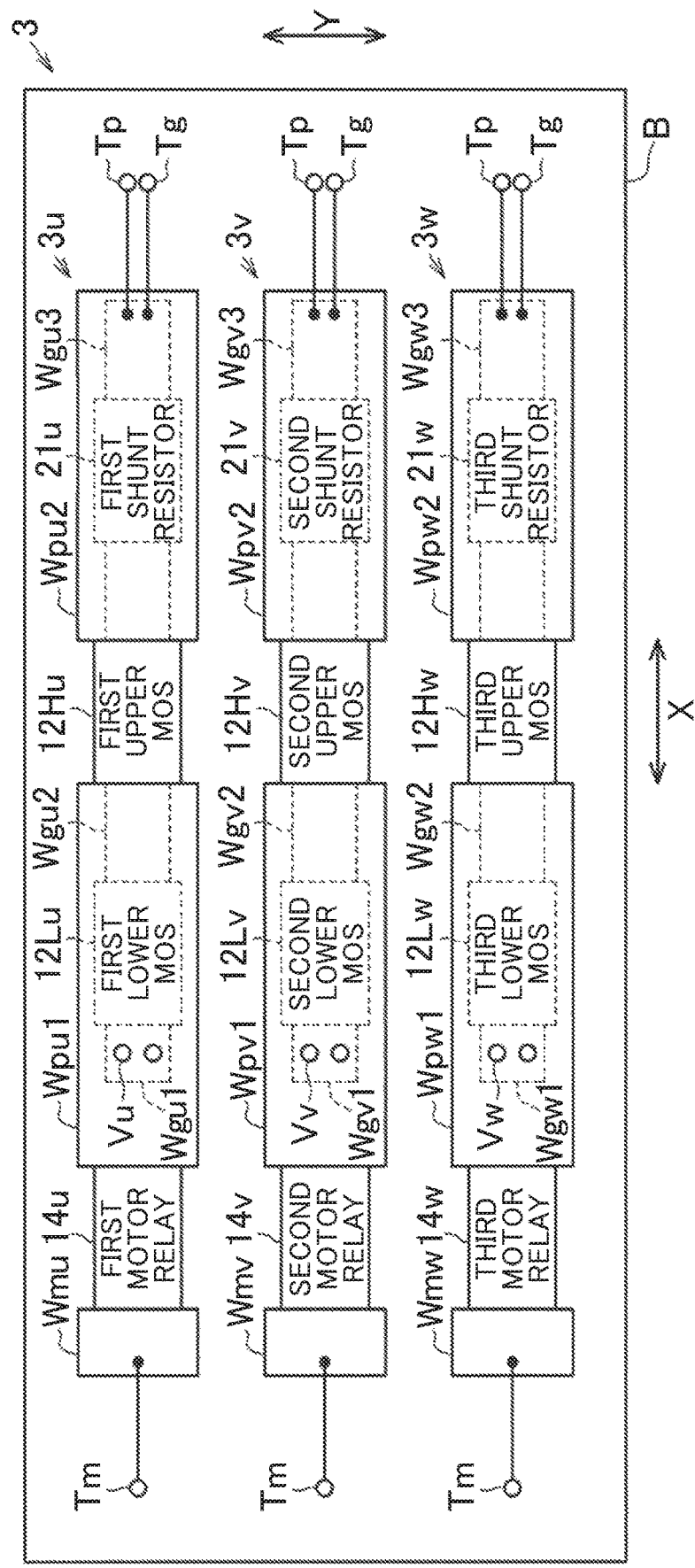
FIG. 2A is a structure diagram illustrating the schematic configuration when the drive circuit of the first embodiment is viewed from the upper surface of a substrate.
Figure 2B:
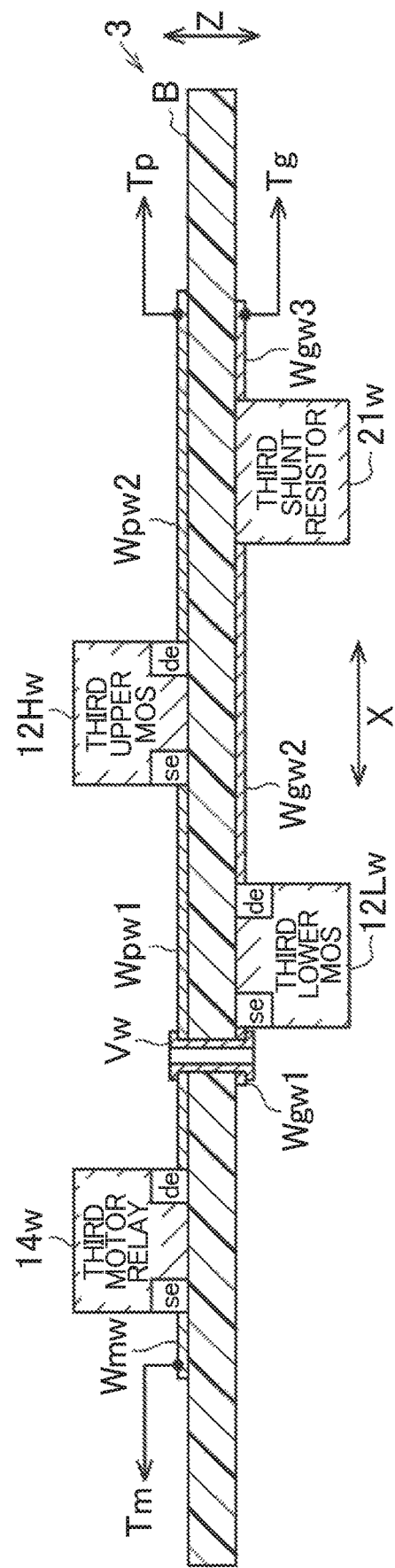
FIG. 2B is a cross-sectional view of FIG. 2A, schematically illustrating a cross-section of a W-phase drive circuit.

As illustrated in FIG. 2A, the components of the drive circuit 3, that is, the first to third upper MOSs 12Hu, 12Hv, and 12Hw, the first to third lower MOSs 12Lu, 12Lv, and 12Lw, the first to third motor relays 14u, 14v, and 14w, and the first to third shunt resistors 21u, 21v, and 21w are disposed separately on both surfaces of the substrate B. The substrate B used herein is a printed circuit board, for example. Note that the U-phase part of the drive circuit 3 is referred to as a U-phase drive circuit 3u; the V-phase part is referred to as a V-phase drive circuit 3v; and the W-phase part is referred to as a W-phase drive circuit 3w.

The U-phase drive circuit 3u, the V-phase drive circuit 3v, and the W-phase drive circuit 3w are arranged in a Y direction of the substrate B (vertical direction in FIG. 2A). The U-phase drive circuit 3u and the V-phase drive circuit 3v are disposed adjacent to each other, and the V-phase drive circuit 3v and the W-phase drive circuit 3w are disposed adjacent to each other, in the Y direction.

When the substrate B is viewed from the front surface side, the components of the U-phase drive circuit 3u, that is, the first upper MOS 12Hu, the first lower MOS 12Lu, the first motor relay 14u, and the first shunt resistor 21u are arranged in an X direction (horizontal direction in FIG. 2A), and are electrically connected to each other. Specifically, the first upper MOS 12Hu and the first motor relay 14u are arranged in the X direction on the front surface of the substrate B, while the first lower MOS 12Lu and the first shunt resistor 21u are arranged in the X direction on the back surface of the substrate B. Similarly, each of the V-phase drive circuit 3v and the W-phase drive circuit 3w has its components arranged in the X direction and electrically connected to each other.

Next, the drive circuit 3 (3u, 3v, and 3w) will be described in detail with reference to FIGS. 2A and 2B. Note that the first to third upper MOSs 12Hu, 12Hv, and 12Hw, the first to third lower MOSs 12Lu, 12Lv, and 12Lw, and the first to third motor relays 14u, 14v, and 14w have their drain electrodes de and source electrodes se on their surfaces on the substrate B side. For simplicity of the drawings, the drain electrodes de, the source electrodes se, and the gate electrodes ge are omitted in FIG. 2A, and the gate electrodes ge are omitted in FIG. 28.

First, the W-phase drive circuit 3w will be described in detail. As illustrated in FIGS. 2A and 28, on the front surface of the substrate B, interconnects Wmw, Wpw1, and Wpw2 are arranged in this order from the left. The interconnect Wmw is connected to a motor terminal Tm of the motor 2 corresponding to the W-phase. Note that the interconnect Wmw forms a part of the power line 18w. The interconnect Wpw2 is connected to a power supply terminal Tp on the path that is connected to the battery 11 and through which DC power flows. Note that the interconnect Wpw2 forms a part of the drain interconnect 15w. The third upper MOS 12Hw is disposed between the interconnect Wpw2 and the interconnect Wpw1. The drain electrode de of the third upper MOS 12Hw is connected to the interconnect Wpw2, and the source electrode se of the third upper MOS 12Hw is connected to the interconnect Wpw1. The third motor relay 14w is disposed between the interconnect Wpw1 and the interconnect Wmw. The drain electrode de of the third motor relay 14w is connected to the interconnect Wpw1, and the source electrode se of the third motor relay 14w is connected to the interconnect Wmw. Note that the interconnect Wpw1 forms a part of the intermediate interconnect 17w and the power line 18w.

On the back surface of the substrate B, interconnects Wgw1, Wgw2, and Wgw3 are arranged in this order from the left. The interconnect Wgw3 is connected to a ground terminal Tg. Note that the interconnect Wgw3 forms a part of the source interconnect 16w. The third shunt resistor 21w is disposed between the interconnect Wgw3 and the interconnect Wgw2. The third lower MOS 12Lw is disposed between the interconnect Wgw2 and the interconnect Wgw1. The drain electrode de of the third lower MOS 12Lw is connected to the interconnect Wgw2, and the source electrode se of the third lower MOS 12Lw is connected to the interconnect Wgw1. Note that the interconnect Wgw2 forms a part of the source interconnect 16w.

The third lower MOS 12Lw is disposed to overlap the interconnect Wpw1 (face the interconnect Wpw1 with the substrate B interposed therebetween) when the drive circuit 3 is viewed from a Z direction (direction of the paper surface of FIG. 2A) orthogonal to the front surface of the substrate B. The third upper MOS 12Hw is disposed to overlap the interconnect Wgw2 when the drive circuit 3 is viewed from the Z direction. The third shunt resistor 21w is disposed to overlap the interconnect Wpw2 when the drive circuit 3 is viewed from the Z direction. The third upper MOS 12Hw, the third lower MOS 12Lw, and the third motor relay 14w are disposed such that the orientations of the respective source electrodes se and drain electrodes de match each other in the X direction.

The substrate B has a via Vw electrically connecting the interconnect Wpw1 and the interconnect Wgw1. Thus, the source electrode se of the third upper MOS 12Hw and the drain electrode de of the third motor relay 14w are electrically connected to the source electrode se of the third lower MOS 12Lw by the via Vw. The via Vw is a through-hole via, for example. The via Vw is a circular hole extending through the substrate B in the Z direction, and the inner wall surface of the hole is subjected to copper plating treatment to electrically connect the interconnect Wpw1 and the interconnect Wgw1. The via Vw is provided in plurality in order to increase the conductivity between the interconnect Wpw1 and the interconnect Wgw1.

Next, the U-phase drive circuit 3u will be described. The configuration similar to that of the W-phase will not be described in detail herein. On the front surface of the substrate B, interconnects Wmu, Wpu1, and Wpu2 are arranged in this order from the left. The interconnect Wmu is connected to a motor terminal Tm (U-phase). The interconnect Wpu2 is connected to the power supply terminal Tp. The first upper MOS 12Hu is disposed between the interconnect Wpu2 and the interconnect Wpu1. The first motor relay 14u is disposed between the interconnect Wpu1 and the interconnect Wmu. On the back surface of the substrate B, interconnects Wgu1, Wgu2, and Wgu3 are arranged in this order from the left. The interconnect Wgu3 is connected to the ground terminal Tg. The first shunt resistor 21u is disposed between the interconnect Wgu3 and the interconnect Wgu2.

The substrate B has a via Vu electrically connecting the interconnect Wpu1 and the interconnect Wgu1. That is, the source electrode se of the first upper MOS 12Hu and the drain electrode de of the first motor relay 14u are electrically connected to the source electrode se of the first lower MOS 12Lu by the via Vu.

Next, the V-phase drive circuit 3v will be described. On the front surface of the substrate B, interconnects Wmv, Wpv1, and Wpv2 are arranged in this order from the left. The interconnect Wmv is connected to a motor terminal Tm (V-phase). The interconnect Wpv2 is connected to the power supply terminal Tp. The second upper MOS 12Hv is disposed between the interconnect Wpv2 and the interconnect Wpv1. The second motor relay 14v is disposed between the interconnect Wpv1 and the interconnect Wmv. On the back surface of the substrate B, interconnects Wgv1, Wgv2, and Wgv3 are arranged in this order from the left. The interconnect Wgv3 is connected to the ground terminal Tg. The second shunt resistor 21v is disposed between the interconnect Wgv3 and the interconnect Wgv2.

The substrate B has a via Vv electrically connecting the interconnect Wpv1 and the interconnect Wgv1. That is, the source electrode se of the second upper MOS 12Hv and the drain electrode de of the second motor relay 14v are electrically connected to the source electrode se of the second lower MOS 12Lv by the via Vv.

Figure 3A:
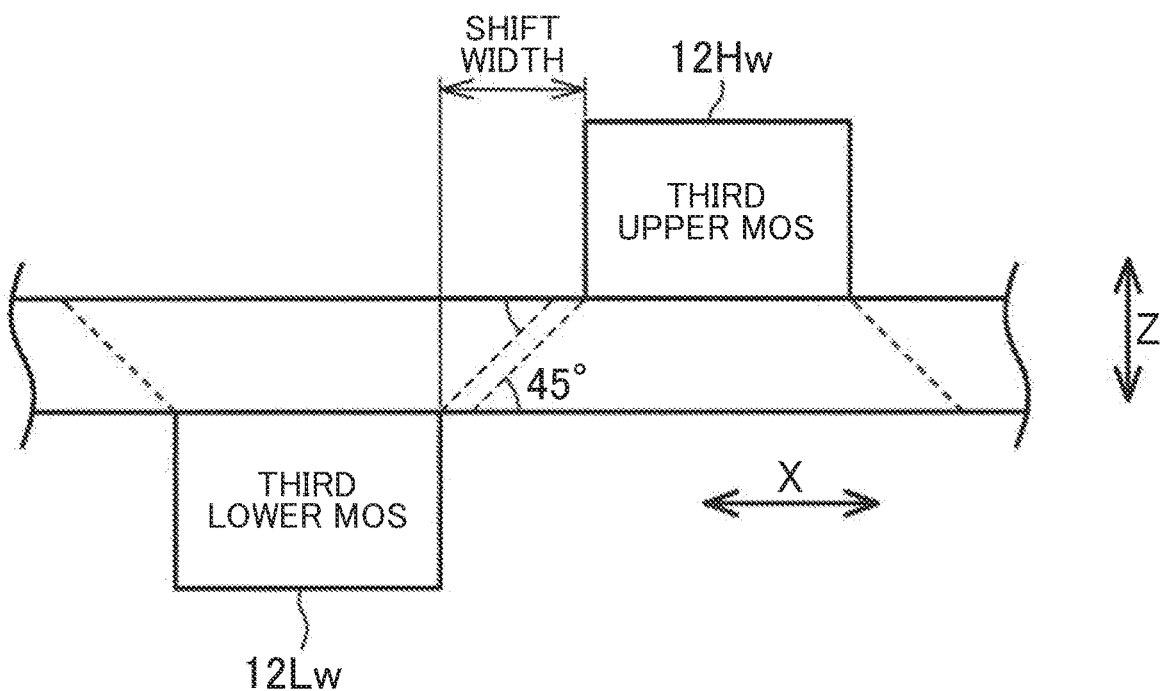
FIG. 3A illustrates the positional relationship between an upper MOS and a lower MOS disposed on the substrate.

As illustrated in FIG. 3A, the third upper MOS 12Hw and the third lower MOS 12Lw are disposed in positions shifted from each other in the X direction as viewed from the Y direction. The shift width between the third upper MOS 12Hw and the third lower MOS 12Lw is set to be greater than or equal to a thickness of the substrate B (predetermined shift amount). This is because, as indicated by the dashed lines in FIG. 3A, heat transferred from the third upper MOS 12Hw and heat transferred from the third lower MOS 12Lw to the substrate B are assumed to be diffused at an angle of approximately 45 degrees with respect to the front surface and the back surface of the substrate B, respectively. Heat generated in the third upper MOS 12Hw is diffused by the thickness of the substrate B when transferred from the front surface to the back surface of the substrate B. However, since the third upper MOS 12Hw and the third lower MOS 12Lw are disposed in the positions shifted by a distance greater than or equal to the substrate thickness, the heat generated in the third upper MOS 12Hw is assumed not to be transferred to the third lower MOS 12Lw. Also, heat generated in the third lower MOS 12Lw is diffused by the thickness of the substrate B when transferred from the back surface to the front surface of the substrate B, but is assumed not to be transferred to the third upper MOS 12Hw. Further, on the substrate B, the heat diffused from the third upper MOS 12Hw and the heat diffused from the third lower MOS 12Lw are assumed to be prevented from overlapping in (being transferred to) an area. Accordingly, by setting the shift width between the third upper MOS 12Hw and the third lower MOS 12Lw to be greater than or equal to the substrate thickness, the heat diffused from the third upper MOS 12Hw and the heat diffused from the third lower MOS 12Lw can be prevented from overlapping in an area.

Note that as illustrated in FIG. 29, the third shunt resistor 21w is also placed in a position shifted with respect to the third upper MOS 12Hw in the X direction as viewed from the Y direction. The shift width between the third shunt resistor 21w and the third upper MOS 12Hw is set to be greater than or equal to the substrate thickness.

Next, the third lower MOS 12Lw will be described in detail.

Figure 4A:
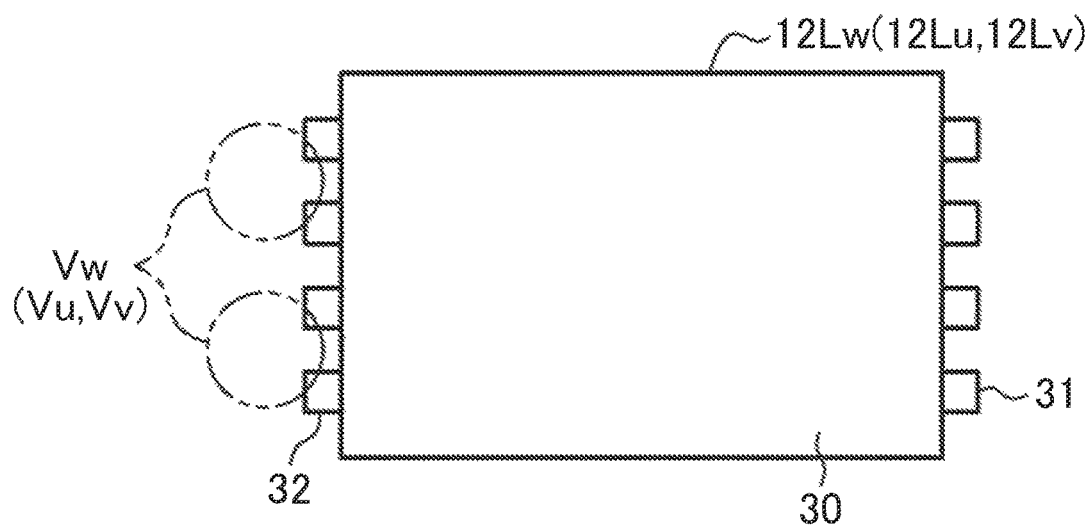
FIG. 4A is a structure diagram illustrating the schematic configuration of a switching element of the drive circuit of the first embodiment.

FIG. 4A illustrates the back surface (surface on the substrate B side) of the third lower MOS 12Lw. The third lower MOS 12Lw includes a main body portion 30 including a semiconductor element (MOS-FET), and a plurality of terminals 31 and 32 extending from the main body portion 30. The main body portion 30 is packaged by covering the semiconductor element with insulating resin. For example, the terminals 31 correspond to a drain electrode de, and the terminals 32 correspond to a source electrode se. Note that some of the plurality of terminals 31 may correspond to a gate electrode ge and the other of the plurality of terminals 31 may correspond to a drain electrode de. Further, one or more of the plurality of terminals 32 may correspond to a gate electrode ge and the other of the plurality of terminals 32 may correspond to a source electrode se. The terminals 31 and 32 may be disposed on the surface of the main body portion 30 on the substrate B side or the surface on the side opposite to the substrate B. Note that the other switching elements, such as the third upper MOS 12Hw, have the same structure as the third lower MOS 12Lw.

Figure 5A:
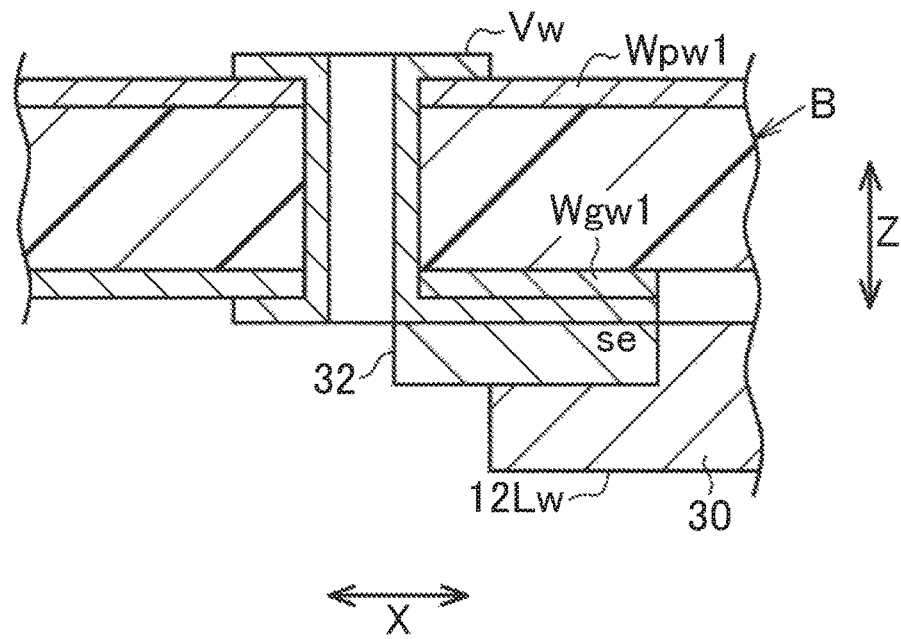
FIG. 5A is a structure diagram illustrating the structure of mounting a lower MOS in the vicinity of a via on a substrate in the drive circuit of the first embodiment.

As illustrated in FIG. 5A, the third lower MOS 12Lw is mounted on the substrate B such that the terminals 32 (source electrode se) is in contact with the interconnect Wgw1 and the via Vw. The third lower MOS 12Lw is disposed on the substrate B such that each terminal 32 at least partially overlaps the via Vw when the substrate B is viewed from the Z direction. Similar to the third lower MOS 12Lw, the other switching elements in the vicinity of the vias Vu, Vv, and Vw are disposed such that the terminals of the switching elements overlap the vias Vu, Vv, and Vw, respectively, when the substrate B is viewed from the Z direction.

The advantageous effects of the present embodiment will be described.

(1) First, a discussion will be made on a case illustrated in FIG. 6 as a comparative example in which drive circuits of a U-phase, a V-phase, and a W-phase are disposed adjacent to each other on the same plane of the substrate B. The following describes the case where the wiring loop is assumed to be maximized. Specifically, the following describes interlinkage flux in the case where power supplied from the battery 11 via the power supply terminal Tp is transmitted to the motor 2 via the U-phase upper MOS and the U-phase motor relay, passes through the W-phase motor relay, the W-phase lower MOS, and the W-phase shunt resistor, and then is transmitted from the ground terminal to ground.

In this case, a current I1 flowing from the U-phase power supply terminal to the U-phase motor terminal via the U-phase upper MOS and the U-phase motor relay has a direction opposite to that of a current I2 flowing from the W-phase motor terminal to the W-phase ground terminal via the W-phase motor relay, W-phase lower MOS, and the W-phase shunt resistor. The path through which the current I1 flows and the path through which the current I2 flows are spaced by a distance L2. The distance L2 is a relatively long distance. This is because the connection points between the intermediate interconnects 17u, 17v, and 17w and the power lines 18u, 18v and 18w of FIG. 1 need to be formed on the same plane of the substrate B, and therefore the U-phase, lower MOS is disposed in the position shifted from the U-phase upper MOS in the Y direction, for example. Accordingly, in the present embodiment, the length of the U-phase drive circuit in the Y direction is assumed to be about that of one MOS-FET. Meanwhile, in the comparative example, the length is assumed to be about that of two MOS-FETs, and thus the U-phase drive circuit is increased in size in the Y direction. Similarly, the V-phase drive circuit and the W-phase drive circuit are assumed to be increased in size in the Y direction, so that the distance L2 is increased.

When the currents I1 and I2 flow, magnetic fields M1 and M2 are produced. The directions of the magnetic fields M1 and M2 correspond to the directions of the currents I1 and I2 and hence are opposite to each other. Accordingly, the magnetic fields M1 and M2 are in a mutually canceling relationship. However, the magnitude of a magnetic field is inversely proportional to the distance, and therefore the magnetic fields M1 and M2 cannot completely cancel each other even when their magnitudes are equal. As the magnetic fields M1 and M2 cannot fully cancel each other, the interlinkage flux is increased. Also, the inductance as the proportionality coefficient between the interlinkage flux and the current flowing through the drive circuit 3 is increased. Note that the magnitude of the interlinkage flux is related to the wiring loop length and the size of the area of the drive circuit 3 as viewed from the Z direction. This is because the area of the drive circuit 3 as viewed from the Z direction can be considered as the area at the time when the interlinkage flux is interlinked with the drive circuit 3. As the wiring loop is increased, that is, as the area of the wiring loop when the substrate B is viewed from the Z direction is increased, the interlinkage flux is increased. The interlinkage flux is the magnetic flux interlinked with the interconnects, among magnetic flux produced by supplying power to the drive circuit 3. As the interlinkage flux is increased, the surge voltage at switching is increased. When the interlinkage flux is increased, ringing is more likely to occur. Further, when the interlinkage flux is increased, torque ripple, that is, variation of motor torque upon rotation of the motor 2 is increased.

Meanwhile, in the present embodiment, the components of each of the U-phase drive circuit 3u, the V-phase drive circuit 3v, and the W-phase drive circuit 3w are disposed separately on both surfaces of the substrate B. The following describes interlinkage flux in the case where the wiring loop is assumed to be maximized as in the case of FIG. 6.

Figure 7A:
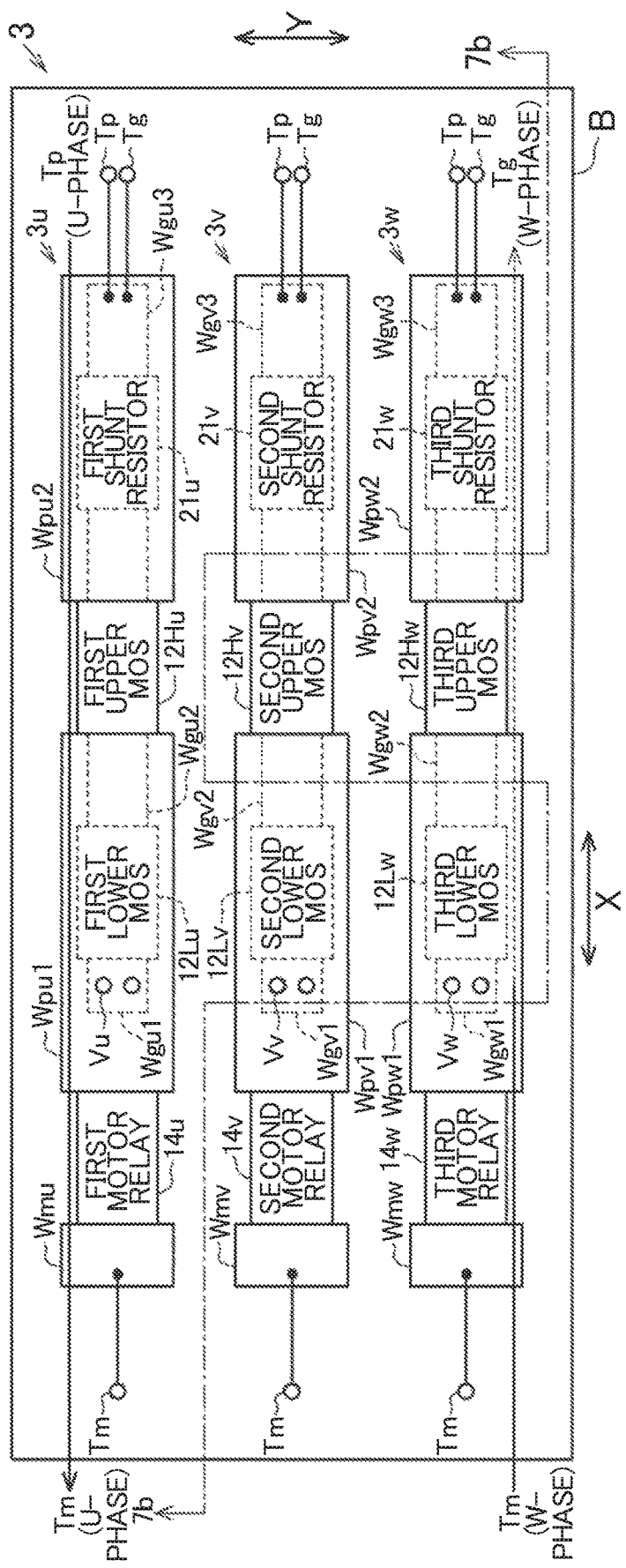
FIG. 7A is a top view illustrating the magnitude of interlinkage flux generated in the drive circuit of the first embodiment.
Figure 7B:
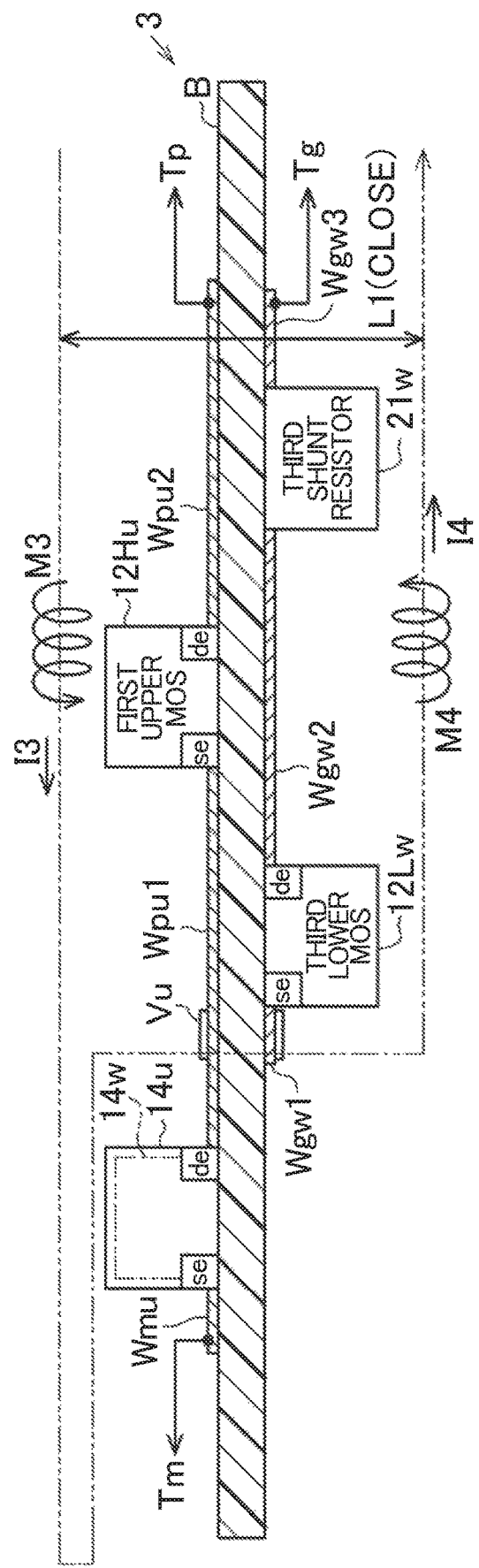
FIG. 7B is a schematic partial cross-sectional view illustrating a U-phase drive circuit and the W-phase drive circuit taken along the line 7b-7b of FIG. 7A.

As illustrated in FIGS. 7A and 7B, power supplied from the battery 11 via the power supply terminal Tp is transmitted to the motor 2 via the first upper MOS 12Hu and the first motor relay 14u. After that, the power supplied to the motor 2 is transmitted to ground via the third motor relay 14w, the third lower MOS 12Lw, and the third shunt resistor 21w.

In this case, a current I3 flowing from the power supply terminal Tp to the motor terminal Tm via the first upper MOS 12Hu and the first motor relay 14u has a direction opposite to that of a current I4 flowing from the motor terminal Tm to the ground terminal Tg via the third motor relay 14w, the third lower MOS 12Lw, and the third shunt resistor 21w. The path of the current I3 and the path of the current I4 are spaced by a distance L1. The distance L1 is less than the distance L2. This is because even when the connection points between the intermediate interconnects 17u, 17v, and 17w and the power lines 18u, 18v, and 18w of FIG. 1 need to be formed, in the case where the first upper MOS 12Hu is disposed on the front surface of the substrate B, it is possible to place the first lower MOS 12Lu in almost the same position as the first upper MOS 12Hu in the Y direction by placing the first lower MOS 12Lu on the back surface of the substrate B. Accordingly, in the present embodiment, the length of the U-phase drive circuit 3u in the Y direction is about that of one MOS-FET. Thus, the U-phase drive circuit 3u is prevented from being increased in size in the Y direction. Similarly, the V-phase drive circuit 3v and the W-phase drive circuit 3w are also prevented from being increased in size in the Y direction. Therefore, the distance L1 is less than the distance L2.

When the currents I3 and I4 flow, magnetic fields M3 and M4 are produced. The directions of the magnetic fields M3 and M4 correspond to the directions of the currents I3 and I4 and hence are opposite to each other. Accordingly, the magnetic fields M3 and M4 are in a mutually canceling relationship. In this case as well, the magnetic fields M3 and M4 cannot completely cancel each other. However, since the distance L1 between the path through which the current I3 flows and the path through which the current I4 flows is less than the distance L2, the magnetic fields M3 and M4 cancel each other to a greater extent. Therefore, the inductance of the drive circuit 3 can be further reduced, so that the interlinkage flux can be further reduced.

In the present embodiment, the length of the drive circuit 3 in the Y direction can be reduced. However, since the components of each of the U-phase drive circuit 3u, the V-phase drive circuit 3v, and the W-phase drive circuit 3w are disposed on both surfaces of the substrate B, the length of the drive circuit 3 in the Z direction is increased. Even in this case, depending on the size of the MOS-FET and the thickness of the substrate B, the wiring loop length of the drive circuit 3 is reduced, and therefore the interlinkage flux is further reduced. Further, even in the case where the wiring loop length of the drive circuit 3 is increased due to the size of the MOS-FET and the thickness of the substrate B, the interlinkage flux can be further reduced. This is because although the front surface and the back surface of the substrate B are conducted to each other through the vias Vu, Vv, and Vw, the Z-direction component of the interconnects of the drive circuit 3 does not greatly affect the interlinkage flux. The vias Vu, Vv, and Vw have physical lengths, but are provided for conduction in the Z direction, and therefore do not affect the area of the drive circuit 3 as viewed from the Z direction.

As described above, since the components of the drive circuit 3 are disposed separately on both surfaces of the substrate B, interlinkage flux can be reduced.

(2) As illustrated in FIG. 4A, each MOS-FET has the terminals 31 and 32 corresponding to its source electrode se and drain electrode de. In the case where the vias Vu, Vv, and Vw are provided, the first to third lower MOSs 12Lu, 12Lv, and 12Lw are disposed to overlap the vias Vu, Vv, and Vw in the X direction, and thus can be arranged in the vicinity of the vias Vu, Vv, and Vw, respectively.

As illustrated in FIG. 5A, the third lower MOS 12Lw is fixed such that the terminal 32 is in contact with the via Vw. Thus, the clearance between the MOS-FETs (for example, between the third lower MOS 12Lw and the third motor relay 14w when the drive circuit 3 is viewed from the Z direction) can be reduced in the X direction. Accordingly, the area of the drive circuit 3 as viewed from the Z direction can be reduced, and interlinkage flux can be reduced.

(3) Heat transferred from the first to third upper MOSs 12Hu, 12Hv, and 12Hw and heat transferred from the first to third lower MOSs 12Lu, 12Lv, and 12Lw to the substrate B are assumed to be diffused at an angle of approximately 45 degrees with respect to the front surface and the back surface of the substrate B, respectively. By setting the shift width between the first to third upper MOSs 12Hu, 12Hv, and 12Hw and the first to third lower MOSs 12Lu, 12Lv, and 12Lw to be greater than or equal to the thickness of the substrate B, respectively, the heat diffused from the first to third upper MOSs 12Hu, 12Hv, and 12Hw and the heat diffused from the first to third lower MOSs 12Lu, 12Lv, and 12Lw can be prevented from overlapping in an area.

Further, the first to third upper MOSs 12Hu, 12Hv and 12Hw are disposed in positions shifted from the first to third shunt resistors 21u, 21v, and 21w by a distance greater than or equal to the thickness of the substrate B. Accordingly, the heat diffused from the first to third upper MOSs 12Hu, 12Hv, and 12Hw and the heat diffused from the first to third shunt resistors 21u, 21v, and 21w can be prevented from overlapping in an area.

With the features described above, heat generated from each component of the drive circuit 3 is prevented from being concentrated on a specific area, so that it is possible to perform heat radiation more efficiently.

(4) Each of the MOS-FETs (first to third upper MOSs 12Hu, 12Hv, and 12Hw, the first to third lower MOSs 12Lu, 12Lv, and 12Lw, and the first to third motor relays 14u, 14v, and 14w) is disposed such that the direction of the drain electrode de and the source electrode se thereof matches the direction of the corresponding interconnect. Accordingly, the wiring length of the drive circuit 3 can be further reduced, so that the interlinkage flux can be further reduced. For example, if the direction of each interconnect is orthogonal to the direction of the source electrode se and the drain electrode de of the corresponding FET, the wiring length of the drive circuit 3 is increased, so that the interlinkage flux is increased.

(5) The U-phase drive circuit 3u, the V-phase drive circuit 3v, and the W-phase drive circuit 3w are arranged in parallel to each other. Accordingly, lengths of the U-phase drive circuit 3u, the V-phase drive circuit 3v, and the W-phase drive circuit 3w in the Y direction can be reduced. Thus, the wiring length of the drive circuit 3 can be reduced, and the interlinkage flux can be further reduced.

(6) Since the interlinkage flux of the drive circuit 3 is reduced, the surge voltage at switching can be reduced, and the occurrence of ringing can be reduced, Since the torque ripple of the motor 2 can be reduced, it is possible to perform motor control with high followability and stability, and to ensure an improved steering feeling.

Hereinafter, a second embodiment will be described in which a drive circuit as a semiconductor device is applied to a vehicle drive device.

Figure 8A:
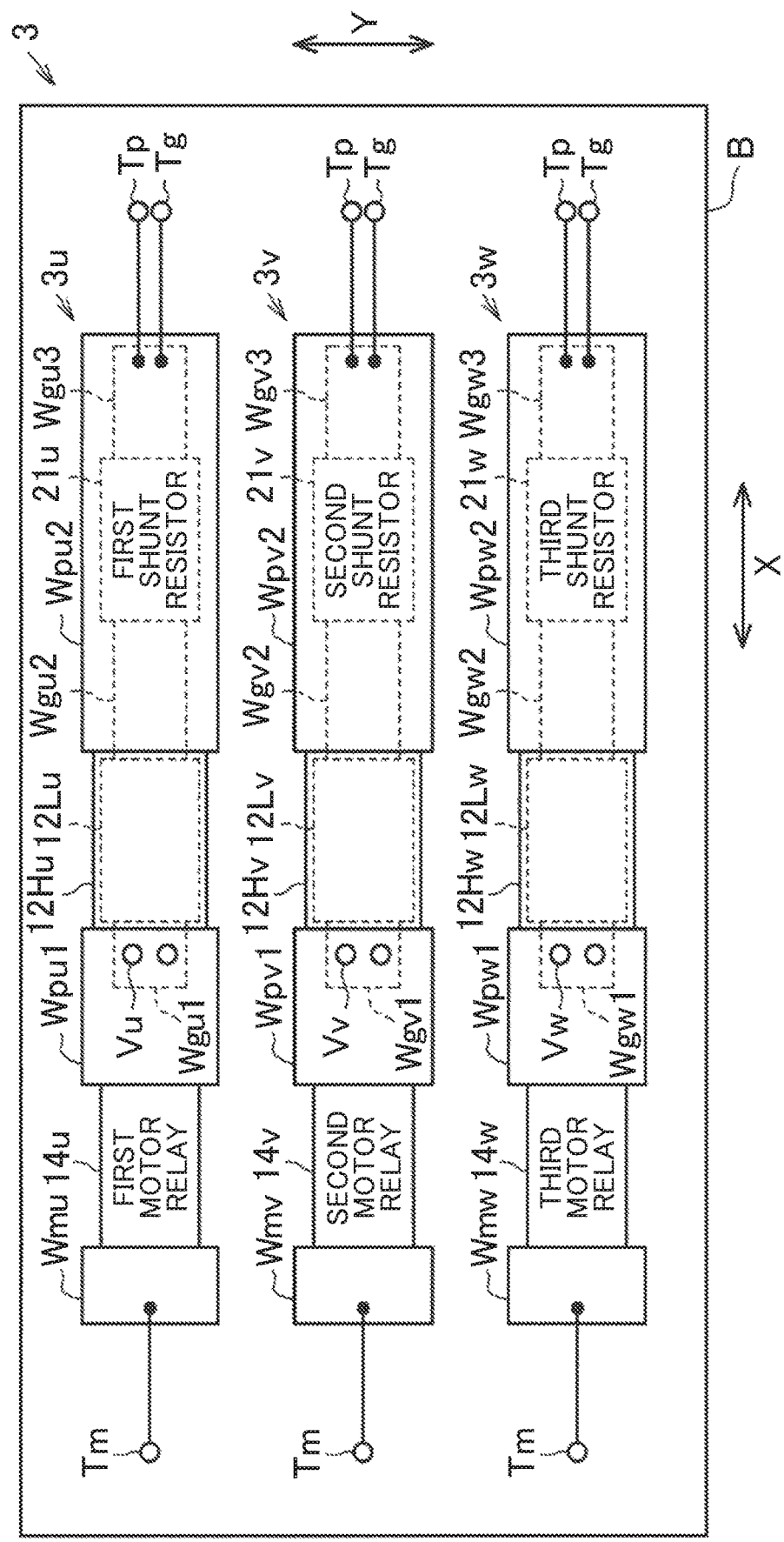
FIG. 8A is a structure diagram illustrating the schematic configuration when a drive circuit of a second embodiment is viewed from the upper surface of a substrate.
Figure 8B:
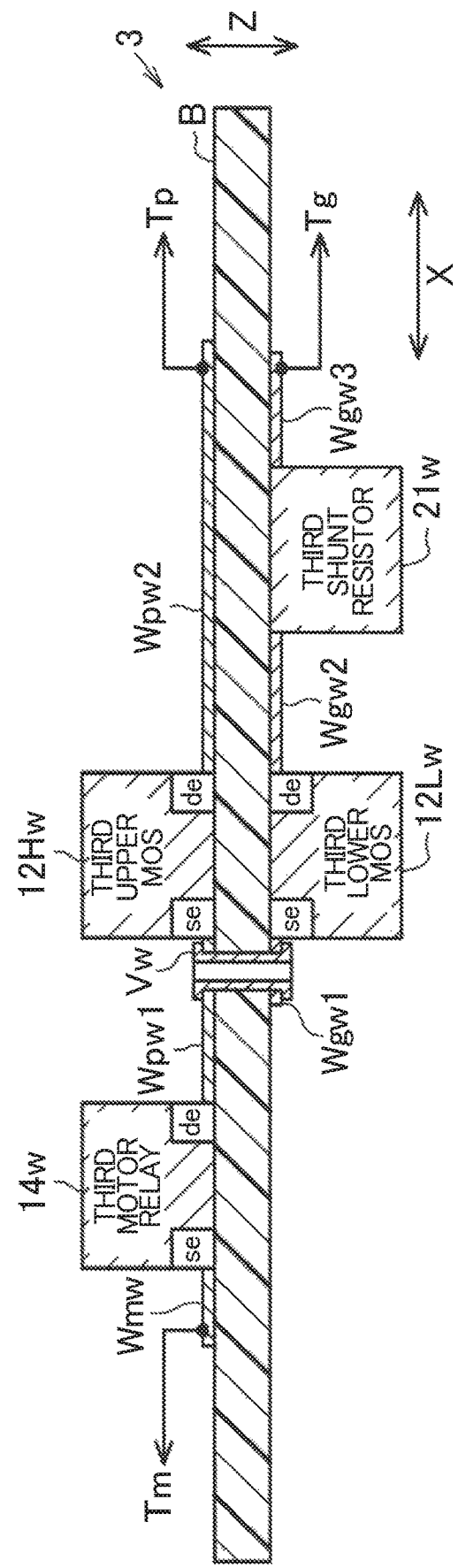
FIG. 8B is a cross-sectional view of FIG. 8A, schematically illustrating a cross-section of a W-phase drive circuit.

As illustrated in FIGS. 8A and 8B, the first to third upper MOSs 12Hu, 12Hv, and 12Hw are disposed on the front surface of the substrate 9, and the first to third lower MOSs 12Lu, 12Lv, and 12Lw are disposed on the back sur ace of the substrate B. The first to third upper MOSs 12Hu, 12Hv, and 12Hw are disposed to face the first to third lower MOSs 12Lu, 12Lv, and 12Lw, respectively, with the substrate B interposed therebetween. That is, the first to third upper MOSs 12Hu, 12Hv, and 12Hw and the first to third lower MOSs 12Lu, 12Lv, and 12Lw may be disposed in the same positions, respectively, when the drive circuit 3 is viewed from the Z direction. Note that the first to third upper MOSs 12Hu, 12Hv, and 12Hw and the first to third lower MOSs 12Lu, 12Lv, and 12Lw may be disposed to slightly overlap, respectively, when the drive circuit 3 is viewed from the Z direction.

The first to third upper MOSs 12Hu, 12Hv and 12Hw are not shifted from the first to third lower MOSs 12Lu, 12Lv, and 12Lw in the X direction, and hence the lengths of the interconnects Wpu2, Wpv2, Wpw2, Wgu2, Wgv2, and Wgw2 in the X direction can be reduced. Further, the length of the drive circuit 3 in the X direction can be reduced, and the mounting area of the components of the drive circuit 3 as viewed from the Z direction is reduced. Accordingly, the area of the drive circuit 3 as viewed from the Z direction can be reduced, so that the interlinkage flux is also reduced.

Note that the above embodiments may be modified as described below. Also, embodiments described below may be combined with each other as long as no technical inconsistency arises.

In the above embodiments, the U-phase drive circuit 3u, the V-phase drive circuit 3v, and the W-phase drive circuit 3w are disposed in this order in the drive circuit 3. However, this order may be changed.

The first to third motor relays 14u, 14v, and 14w do not have to be provided.

In the above embodiments, the three-shunt system using the first to third shunt resistors 21u, 21v, and 21w is employed. However, the present invention is not limited thereto. For example, a single-shunt system using only a single shunt resistor may be employed. Further, the current detection system does not have to use a shunt resistor. That is, the first to third shunt resistors 21u, 21v, and 21w do not have to be provided.

In the above embodiments, a MOS-FET is used as a switching element. However, the present invention is not limited thereto. For example, an insulated-gate bipolar transistor (IGBT) may be used instead.

In the above embodiments, the drive circuit 3 is a three-phase drive circuit. However, the drive circuit 3 only needs to be a drive circuit of two or more phases.

Two drive circuits 3 may be arranged adjacent to each other to provide redundancy.

Figure 4B:
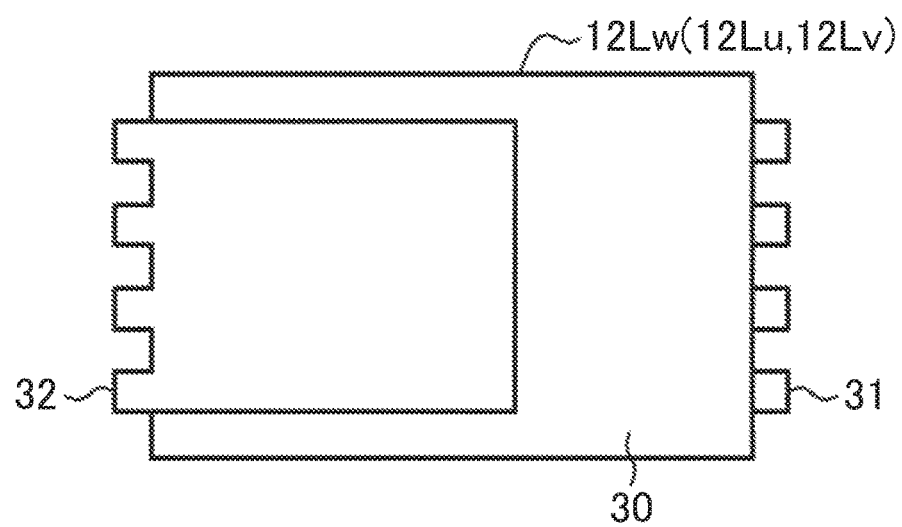
FIG. 4B is a structure diagram illustrating the schematic configuration of a switching element of a drive circuit of another embodiment.
Figure 5B:
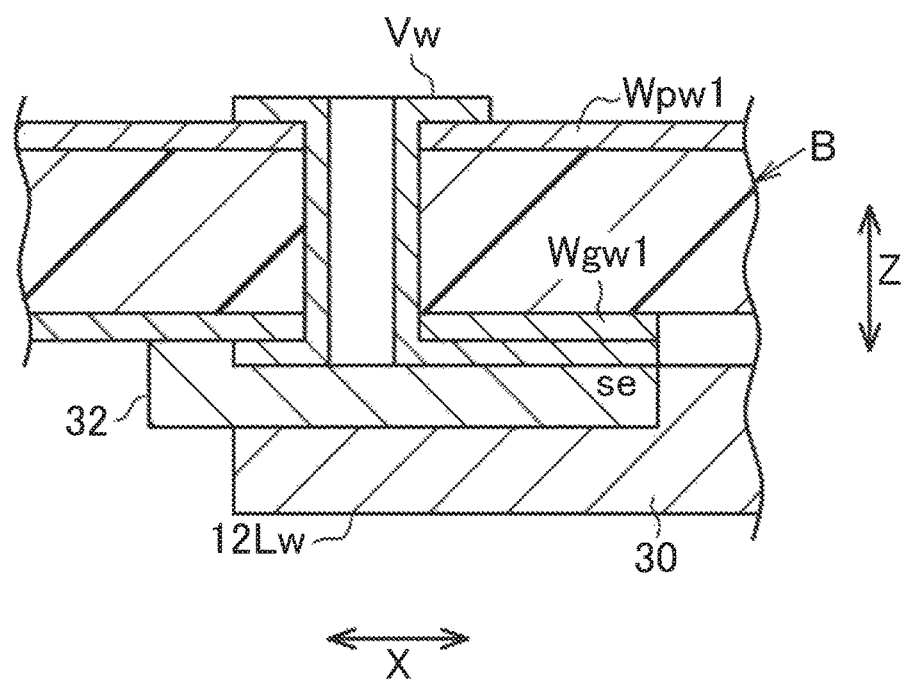
FIG. 5B is a structure diagram illustrating the structure of mounting a lower MOS in the vicinity of a via on a substrate in a drive circuit of another embodiment.

As illustrated in FIG. 4B, the third lower MOS 12Lw (each MOS-FET) may be provided such that the terminal 32 covers the back surface (surface on the substrate B side) of the main body portion 30. In this case, as illustrated in FIG. 5B, the third lower MOS 12Lw is disposed on the substrate B such that the terminal 32 entirely covers the vias Vw. Thus, the distance between the MOS-FETs (for example, between the third lower MOS 12Lw and the third motor relay 14w when the drive circuit 3 is viewed from the Z direction) can be reduced. Accordingly, the area of the drive circuit 3 as viewed from the Z direction can be reduced.

The terminals of the first to third lower MOSS 12Lu, 12Lv, and 12Lw may be disposed not to overlap the vias Vu, Vv, and Vw when the substrate B is viewed from the Z direction.

Figure 4C:
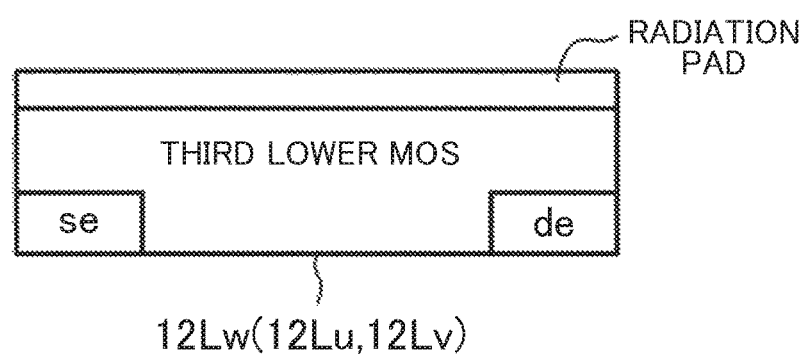
FIG. 4C is a structure diagram illustrating the schematic configuration of a switching element of a drive circuit of another embodiment.

As illustrated in FIG. 4C, a radiation pad may be provided on the front surface (surface on the side opposite to the substrate B) of the main body portion 30 of the third lower MOS 12Lw (each MOS-FET). In this case, heat generated in the third lower MOS 12Lw is radiated from not only the substrate B side but also the radiation pad.

In the above embodiments, in the U-phase drive circuit 3u, the first upper MOS 12Hu and the first motor relay 14u are disposed on the front surface of the substrate B, and the first lower MOS 12Lu and the first shunt resistor 21u are disposed on the back surface. In this case, the W-phase drive circuit 3w has the same arrangement as the U-phase drive circuit 3u. Referring to FIGS. 7A and 7B, the current I3 flows through the front surface of the substrate B, while the current I4 flows through the back surface of the substrate B.

While the U-phase drive circuit 3u has its components arranged in the manner described above, the W-phase drive circuit 3w may have the third lower MOS 12Lw and the third shunt resistor 21w on the front surface of the substrate B, and the third upper MOS 12Hw and the third motor relay 14w on the back surface. In this case, the current I3 flowing from the power supply terminal Tp to the motor terminal Tm via the first upper MOS 12Hu and the first motor relay 14u passes through the front surface of the substrate B. Further, the current I4 flowing from the motor terminal Tm to the ground terminal Tg via the third motor relay 14w, the third lower MOS 12Lw, and the third shunt resistor 21w also passes through the front surface of the substrate B. Accordingly, in the W-phase drive circuit 3w that is the most distant from the U-phase drive circuit 3u, the currents I3 and I4 pass through the same surface of the substrate B. Therefore, the length of the wiring loop can be reduced by the thickness of the substrate B, and the interlinkage flux can be further reduced.

Figure 3B:
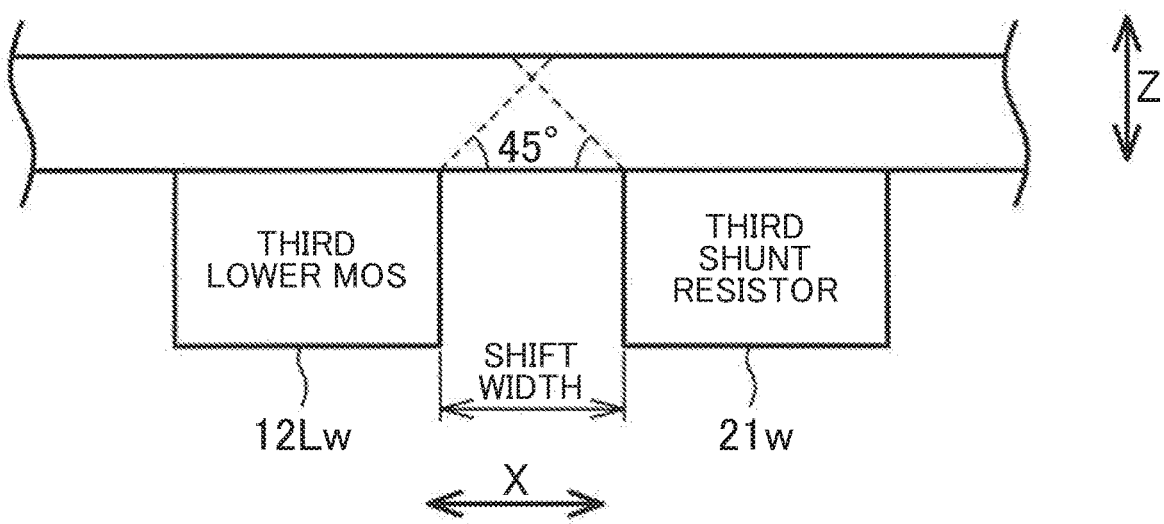
FIG. 3B illustrates the positional relationship between a lower MOS and a shunt resistor disposed on a substrate in a comparative example.

In the first embodiment, the first to third upper MOSs 12Hu, 12Hv, and 12Hw, the first to third lower MOSs 12Lu, 12Lv, and 12Lw, the first to third motor relays 14u, 14v, and 14w, and the first to third shunt resistors 21u, 21v, and 21w are disposed in positions shifted from each other as viewed from the Z direction. However, if heat does not matter much, the first to third upper MOSs 12Hu, 12Hv, and 12Hw and the first to third lower MOSs 12Lu, 12Lv, and 12Lw may be disposed to slightly overlap, respectively, as viewed from the Z direction. Further, for example, as illustrated in FIG. 3B, if both the third lower MOS 12Lw and the third shunt resistor 21w are disposed on the back surface of the substrate B, the heat diffused from the third lower MOS 12Lw and the heat diffused from the third shunt resistor 21w are likely to overlap. Even in this case, if heat does not matter much, the third lower MOS 12Lw and the third shunt resistor 21w may be disposed close to each other.

In the first embodiment, the first to third lower MOSs 12Lu, 12Lv, and 12Lw are disposed between the first to third upper MOSs 12Hu, 12Hv, and 12Hw and the first to third shunt resistors 21u, 21v, and 21w, respectively, as viewed from the Z direction. However, the present invention is not limited thereto.

Figure 9A:
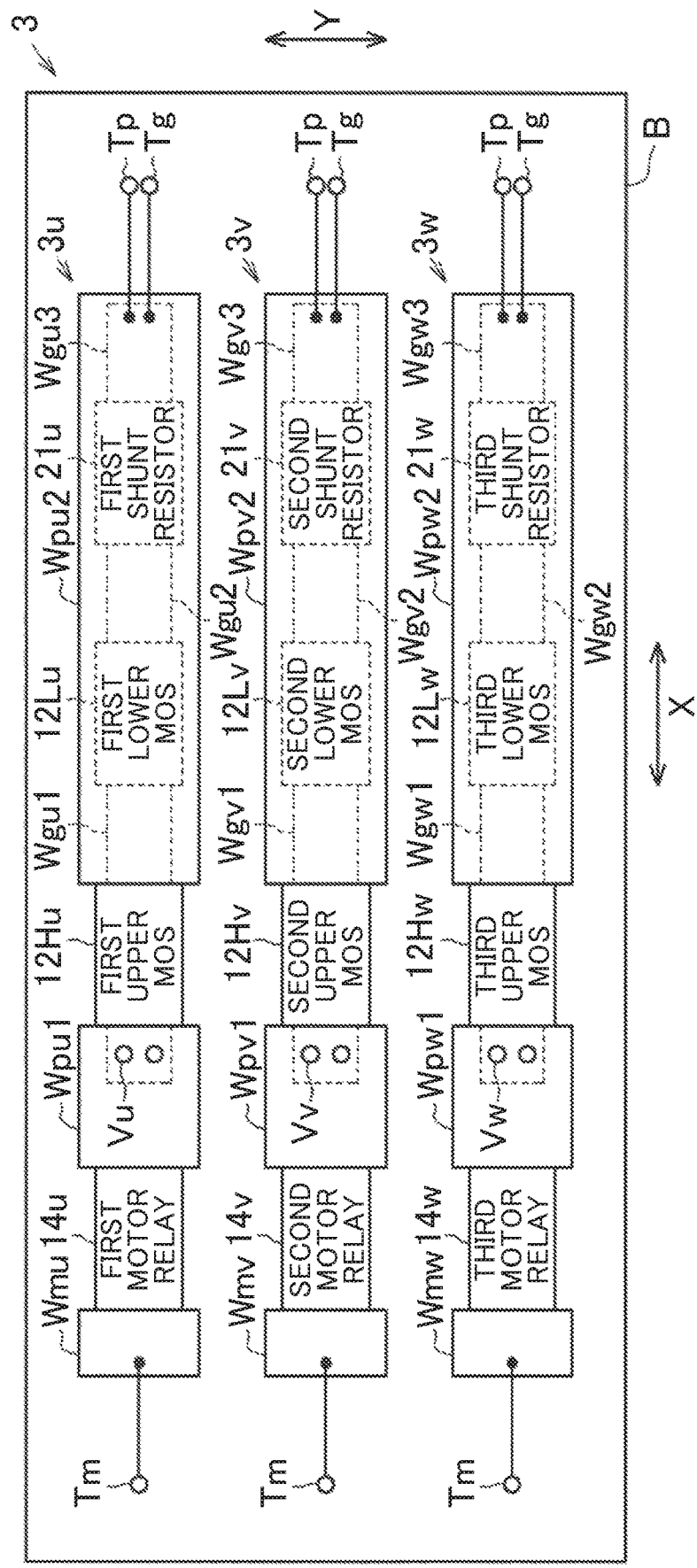
FIG. 9A is a structure diagram illustrating the schematic configuration when a drive circuit of another embodiment is viewed from the upper surface of a substrate.
Figure 9B:
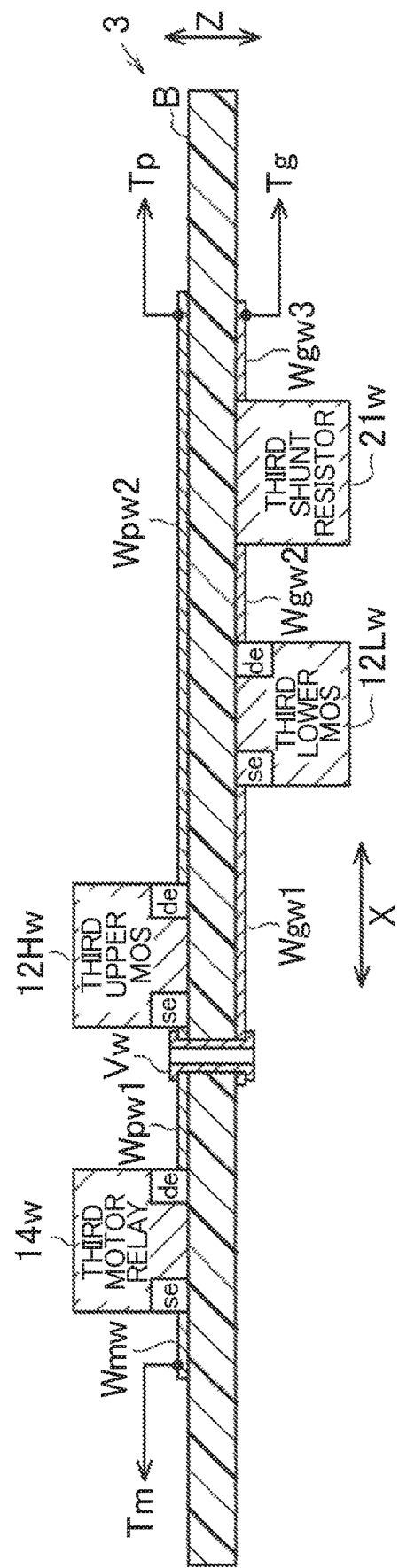
FIG. 9B is a cross-sectional view of FIG. 9A, schematically illustrating a cross-section of a W-phase drive circuit.

As illustrated in FIGS. 9A and 9B, if heat does not matter much, the positions of the first to third upper MOSs 12Hu, 12Hv, and 12Hw and the positions of the first to third lower MOSS 12Lu, 12Lv, and 12Lw may be switched in the X direction without changing the surfaces on which these individual components are disposed. In this ease, the first to third lower MOSs 12Lu, 12Lv, and 12Lw are adjacent to the first to third shunt resistors 21u, 21v, and 21w.

In the above embodiments, each of the U-phase drive circuit 3u, the V-phase drive circuit 3v, and the W-phase drive circuit 3w has its components on both surfaces of the substrate B. However, only one of the phases of the drive circuit 3 may have its components on both surfaces of the substrate B.

The substrate B may be made of any insulating material such as resin.

Each of the vias Vu, Vv, and Vw may be a through-hole with its inner surface of the hole subjected to plating treatment, or may be a hole filled with conductive paste. That is, each of the vias Vu, Vv, and Vw may be any via as long as the via serves as a path that provides conductivity between the two surfaces of the substrate B.

The drive circuit 3 of each embodiment is a three-phase drive circuit for a three-phase brushless motor. However, the present invention is not limited thereto. For example, the drive circuit 3 may include half bridges for a plurality of phases, each including an upper switching element and a lower switching element. The target to which the drive circuit 3 supplies power is not limited to the motor 2, and may be any target.

According to a semiconductor device of the present invention, since the wiring loop of the semiconductor device is reduced, interlinkage flux can be further reduced.

What is claimed is:

1. A semiconductor device comprising:
   a substrate; and
   a plurality of half bridges disposed on the substrate, each of the plurality of half bridges including an upper switching element and a lower switching element connected in series, the upper switching element being connected to a power supply, the lower switching element being connected to a ground, the plurality of half bridges being connected in parallel, and the plurality of half bridges are disposed adjacent to each other and disposed with a same order from an interconnect for a motor to an interconnect of the power supply,
   wherein:
      at least one of the upper switching elements is disposed on a first surface of the substrate, and the lower switching elements are disposed on a second surface of the substrate opposite to the first surface,
      the substrate includes a path electrically connecting the upper switching element and the lower switching element of a same one half bridge of the plurality of half bridges, the path having a portion extending through the substrate, and
      when the substrate is viewed from a direction in which the first surface and the second surface oppose to each other, the upper switching element and the lower switching element of the same one half bridge of the plurality of half bridges are disposed in positions shifted from each other by a predetermined shift amount in a direction orthogonal to a direction in which the plurality of half bridges are arranged.

2. The semiconductor device according to claim 1, wherein the upper switching element and the lower switching element of the same one half bridge of the plurality of half bridges are arranged in the direction orthogonal to the direction in which the plurality of half bridges of respective phases are arranged.

3. The semiconductor device according to claim 1, wherein the upper switching element and the lower switching element of each half bridge of the plurality of half bridges is disposed such that a direction in which a drain electrode and a source electrode of each half bridge of the plurality of half bridges are arranged matches a direction in which an interconnect between the upper switching element and the lower switching element in the respective half bridge extends.

4. The semiconductor device according to claim 1, further comprising a plurality of shunt resistors that detect currents flowing through respective phases are disposed on the substrate,
   wherein when the substrate is viewed from a direction in which the first surface and the second surface oppose to each other, each shunt resistor of the plurality of shunt resistors is disposed in a position shifted from at least one of the upper switching element and the lower switching element of the same one half bridge of the plurality of half bridges by a predetermined shift amount in the direction orthogonal to the direction in which the plurality of half bridges are arranged.

5. The semiconductor device according to claim 1, wherein:
   the motor is a three-phase motor, and power is supplied to the three-phase motor via the plurality of half bridges, the three-phase motor being a power supply target; and
   a direction of a current flowing from the power supply to the power supply target via the respective upper switching element is (i) opposite to a direction of a current flowing from the power supply target to the ground via the respective lower switching element, or (ii) shifted from a direction orthogonal to the direction of the current flowing from the power supply target to the ground via the respective lower switching element.

6. The semiconductor device according to claim 1, wherein:
   each of the upper switching elements and the lower switching elements has two surfaces in the direction orthogonal to the direction in which the plurality of half bridges are arranged,
   a terminal corresponding to a source electrode and a terminal corresponding to a drain electrode extend from the respective two surfaces of each of the upper switching elements and the lower switching elements, and
   each of the terminals is electrically connected to the path in a position overlapping the path when the substrate is viewed from a direction in which the first surface and the second surface of each of the terminals oppose to each other.

\* \* \* \* \*